United States Patent [19]

Fujita et al.

[11] Patent Number: 4,695,965

[45] Date of Patent: Sep. 22, 1987

[54] MONITORING DATA DISPLAY METHOD AND DEVICE

[75] Inventors: Shigeru Fujita; Hideo Banzai; Makoto Takada, all of Numazu, Japan

[73] Assignee: Toshiba Kikai Kabushiki Kaisha, Tokyo, Japan

[21] Appl. No.: 580,822

[22] Filed: Feb. 16, 1984

[30] Foreign Application Priority Data

Feb. 22, 1983 [JP] Japan .................................. 58-28851

[51] Int. Cl.[4] ........................ G06F 15/40; G09G 1/06; G01R 19/50

[52] U.S. Cl. .................................... 364/518; 340/732; 364/521; 364/550; 364/483

[58] Field of Search ............... 364/550, 551, 150, 153, 364/171, 188, 189, 518, 520, 521, 483; 318/636; 340/722, 732

[56] References Cited

U.S. PATENT DOCUMENTS 2,910,681 10/1959 Mita ................................ 340/743 X
3,398,364 8/1968 Rittenbach ......................... 324/77 C
3,582,629 6/1971 Ross ................................ 318/636 X
3,811,040 5/1974 Weinfurt et al. ............... 340/722 X
3,881,059 4/1975 Stewart ............................. 381/48 X
3,947,665 3/1976 Hundley ......................... 364/153 X
4,212,009 7/1980 Adleman et al. ................... 340/728
4,275,439 6/1981 Kuwata ........................... 364/188 X
4,386,614 6/1983 Ryan .............................. 340/722 X
4,504,916 3/1985 Oka ....................................... 364/471
4,523,286 6/1985 Koga et al. ...................... 364/550 X
4,562,548 12/1985 Andersen et al. .................. 364/483

*Primary Examiner*—Errol A. Krass
*Assistant Examiner*—Joseph L. Dixon
*Attorney, Agent, or Firm*—Stevens, Davis, Miller & Mosher

[57] ABSTRACT

A technique is disclosed for displaying monitoring data of a continuously varying operation condition of a drive mechanism driven by an actuator, in which data of one operation cycle of the drive mechanism is detected preliminarily as reference data and data for another operation cycle succeeding to the one operation cycle is detected. The last-detected data is then superposed on the reference data and displayed on a coordinate axis on a monitor to show deviation between the reference data and the detected data of each operation cycle. Allowable uppermost and lowermost limit data of the reference data are also calculated and displayed on the same coordinate axis of the displaying surface of the monitor.

2 Claims, 4 Drawing Figures

MONITORING DATA DISPLAY METHOD AND DEVICE

BACKGROUND OF THE INVENTION

This invention relates to a monitoring method and device for monitoring operations of a mechanism, such as an injection device of an injection molding machine, driven by an actuator and, more particularly, to a monitoring data display method and device in which analog data variable in accordance with lapse of time is subjected to multipoint sampling and the data is displayed in or on a recorder or display tube.

With a conventional technique of recording of an analog data regarding a rapidly variable operation of a mechanism driven by an actuator, the analog data could be recorded only by the use of a fast acting recorder. However, in a conventional method of multipoint sampling and display of such data, when operation time and/or operation speed of the drive mechanism varies, a length of an axis of abscissa representing time (lapse of time) must be expanded or shortened at a time of monitoring the whole sampling numbers and the comparison of this data has to be made by changing the sampling mode, i.e. output frequency to a recorder or a display tube, every time the operation time and/or operation speed varies.

In another method for visually deciding the fact whether or not a profile of the detected data accords with a first displayed operation condition at a time of reproduction of a certain operation condition, there was not any convenient device suitable for comparing a reference profile with a sample profile and upper most and lowermost profiles of the reference with the sample profile by superposing the profiles. Moreover, in a case where the profile of the detected data exhibits operational characteristics different from the reference profile, it was difficult to clearly display a stage at which the difference of the characteristics occurred during the operation of the drive mechanism, i.e. first, intermediate, or final stage of the operation.

SUMMARY OF THE INVENTION

An object of this invention is to provide a monitoring data display method and device capable of visually superposing a reference data profile and a sample data profile, and moreover, allowable uppermost and lowermost limits of the reference data profile and a sample data profile at a time of reproduction of the operational characteristics.

Another object of this invention is to provide a monitoring data display method and device capable of visually discriminating the fact at which stage of the data detection the operational characteristic occurs by applying sectioning signals.

A further object of this invention is to provide a monitoring data display device including automatically operating means for operating sampling and display frequencies of the data for easily discriminating profiles regardless of the speed of operational condition to be monitored.

In one aspect, according to this invention, there is provided a method of displaying monitoring data of a continuously varying operation condition of a drive mechanism driven by an actuator in which data regarding the operation of the drive mechanism is detected as a variable of time and sampled at multipoints, the data is outputted with a frequency identical to or different from a sampled frequency, and the data is then displayed, and the method is characterized by the steps of storing detected data of one operation cycle of the drive mechanism as reference data, preliminarily displaying the reference data, and visually superposing detected data of an operation cycle of the drive mechanism succeeding to the one operation cycle on the reference data on a coordinate axis for monitoring deviation between the detected data and the reference data of one operation cycle of the drive mechanism.

In another aspect, according to this invention, there is provided a device for carrying out the method described above generally comprising detecting means for detecting data regarding an operation of the drive mechanism as a variable of time, monitoring means operatively connected to the detecting means for monitoring the detected data, and display means for displaying and comparing the detected data, and the device is characterized in that the monitoring means comprises a signal transmitting unit, a memory unit operatively connected to the detecting means and the signal transmitting unit for storing detected data of one operation cycle of the drive mechanism as reference data, and an operation unit operatively connected to the memory unit and the signal transmitting unit for discriminating and comparing conditions of the reference data and detected data of an operation cycle of the drive mechanism succeeding to the one operation cycle, and in that the display means includes a display unit in which the reference data is preliminarily displayed and the detected data of the operation cycle succeeding to the one operation cycle is visually superposed on the reference data on a coordinate axis.

DESCRIPTION OF THE PREFERRED EMBODIMENTS

Figure 1:
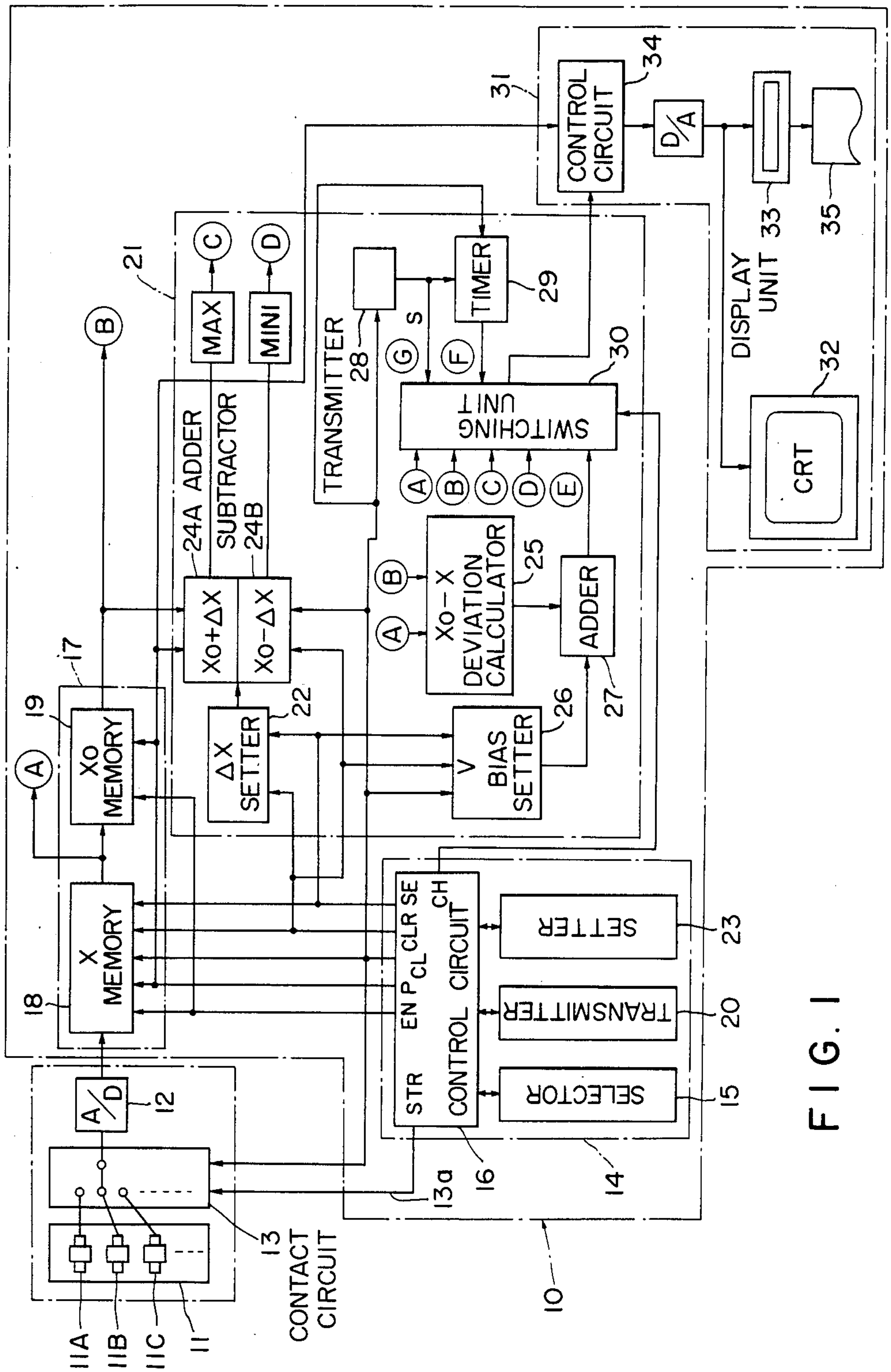
FIG. 1 is a block diagram showing a monitoring data display device according to this invention.

Referring to FIG. 1, a monitoring unit of a monitoring data display device according to this invention is enclosed with dash and dot lines and designated by reference numeral 10. A detecting device 11 for detecting physical parameters such as temperature, pressure, and speed of a mechanism, for example, an injection system in an injection molding machine, driven by an actuator includes a plurality of detectors 11A, 11B, 11C, . . . for sensing the temperature, the pressure, and the speed, one of which is operatively selected, as occasion demands, by a sampling mode selector 15 contained in signal transmitting means 14 assembled in the monitoring device 10. A contact circuit 13 is operatively connected to the detecting device 11 and operates so as to select one of detectors 11A, 11B, 11C, . . . in accordance with a signal 13*a* generated from a signal control circuit 16, which is assembled in the signal transmitting means 14 and also operatively connected to the contact circuit 13 by depressing a key, not shown, attached to the sampling mode selector 15.

Memory means for memorizing the data detected by the detector 11 is contained in the monitoring device 10 and designated by reference numeral 17. The memory means 17 includes a detected (active) data memory 18 and a reference data memory 19. When an operator for operating the drive mechanism discriminates that the data memorized in the memory 18 itself is an aimed data for setting it as a reference data, the operator depresses a key, not shown, attached to a signal transmitter 20 contained in the signal transmitting means 14 to thereby generate a reference data setting signal EN from the control circuit 16, and then, the data from the memory 18 is transferred and set in the reference data memory 19 as a reference data Xo. After the reference data Xo has once been memorized in the memory 19, data detected thereafter by the detector 11 is monitored so as to accord with the reference data Xo during the operation of the drive mechanism.

The monitoring device 10 further includes discriminating and comparing means 21 in which the condition of the detected data X is discriminated in comparison with the reference data Xo set in the reference data memory 19, for example, for discriminating and comparing a fact whether or not the detected data X is within a predetermined allowable range of the reference data Xo.

The discrimination means 21 includes a ΔX setter 22 for setting a data representing an allowable variation range ΔX (allowance) of the reference data Xo and the allowance ΔX is inputted into the ΔX setter 22 by a signal SE generated from the control circuit 16 by depressing a key, not shown, located to the setter 23 in the signal transmitting means 14. The allowance data ΔX recorded in the ΔX setter 22 is then sent to an adder 24A or subtractor 24B for calculating an allowable maximum data (Xo+ΔX) or allowable minimum data (Xo−ΔX) for operating the drive mechanism.

The discrimination means 21 further includes a deviation calculator 25 for determining the difference (Xo−X) between the reference data Xo and the detected data X and a bias setter 26 into which a signal from the control circuit 16 is inputted by depressing a key, not shown, of the setter 23 of the signal transmitting means 14. The bias setter 26 operates to add a predetermined bias value V through the adder 27 so that the difference data (Xo−X) does not become negative. A sectioning signal transmitter 28 is operatively connected to the control circuit 16 and generates a sectioning signal S every predetermined lapse of time in the operation of the driving mechanismin accordance with a clock pulse CL generated from the control circuit 16. Reference numeral 29 designates a timer operator 29 which calculates an operating time of one operation cycle of the drive mechanism in use of a counter, for example, and operates a sampling period for the multipoint sampling operation and a period for outputting the sampling period for a recorder. The data obtained by the timer 29 is represented by F in FIG. 1.

A data switching unit 30 is further included in the discrimination means 21 for carrying out a data switching operation based on the inputted data, represented by A through G in FIG. 1, in accordance with a change-over signal CH generated by the signal transmitter 20 through the control circuit 16.

Display means 31 is operatively connected to the monitoring device 10 and includes a CRT (cathode ray tube) 32 and a recorder or display unit 33 for visually displaying varying compared and/or operated results obtained in the operation of the discriminating and comparing means 21. A display control circuit 34 controls the CRT 32 and the recorder 33 and is operated by a display signal P generated from the circuit 16 by depressing a key assembled in the signal transmitter 20. A hard copy 35 of the displayed material can be obtained as occasion demands.

The setter 23 is also provided with a member such as a key, not shown, for transmitting a clear signal CLR to cancel the set values inputted into the allowance setter 22 and/or the bias setter 26. Moreover, in the embodiment shown in FIG. 1, although the sampling mode selector 15, the signal transmitter 20, and the setter 23 are independently assembled in the signal transmitting means 14, they can be constructed as one unit.

As described above, the display device of this invention includes three keys assembled in association with the sampling mode selector 15, the signal transmitter 20 and the setter 23, respectively, for operating the same. These keys are once depressed respectively at a time of starting the monitoring operation and after the selection or settings of the operational conditions have been completed these keys are not depressed thereafter except when a change of operational conditions is required.

The monitoring data display device according to this invention and shown in FIG. 1 operates as follows.

When it is required to monitor operating condition of a drive mechanism, a clock pulse generating key located in the signal transmitter 20 is first depressed to generate a clock pulse CL from the signal control circuit 16 and start the counting of the operation cycle time for the drive mechanism. The signal STR is then generated to operate the contact circuit 13 and start the operation of the monitoring device 10. After the data recorded in the active data memory 18 has been transferred to the reference data memory 19 as a reference data Xo, the display of the operating condition of the drive mechanism on the display means 31 can be done by the display signal P generated from the control circuit 16 by depressing the key of the signal transmitter 20 thereby to take out the necessary data represented by A through G shown in FIG. 1.

Figure 2:
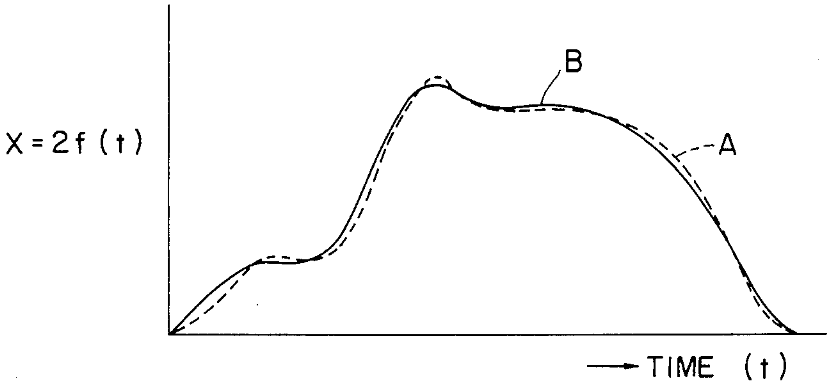
FIG. 2 shows a graph displayed on a display unit of the device shown in FIG. 1, in which a reference data profile and a detected data profile are superposed.
Figure 3:
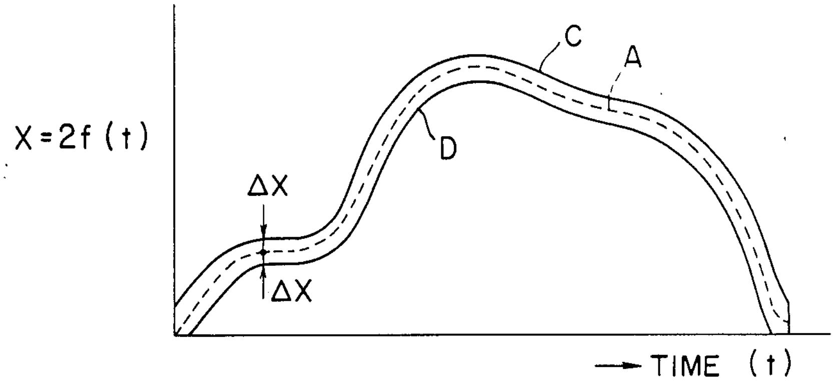
FIG. 3 shows a graph displayed on the display unit shown in FIG. 2, in which an allowable data profile of the reference data and a detected data profile are superposed.

FIG. 2 shows one example of a displayed graph having an axis of abscissa representing time and an axis of ordinate representing physical amount such as pressure, temperature, or speed and in which the curve A shows the detected (active) data and the curve B shows the reference data. FIG. 3 shows another example of a displayed graph in which the maximum and minimum data (curves C and D, respectively) of the allowable range of the reference data are displayed in comparison with the detected data (curve A).

Figure 4:
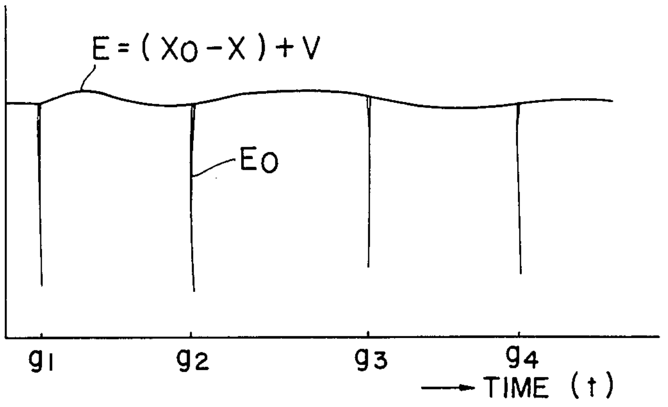
FIG. 4 shows a deviation profile between the reference data and the detected data displayed on the display unit shown in FIG. 2, in which a bias data V is added to the zero level.

FIG. 4 is a graph showing a case where data E (=(Xo−X)+V) inputted into the switching unit 30 from the adder 27 is taken out in connection with the sectioning time G from the timer 29, and in the graph, the deviation profile between the reference data and the detected data is shown and time values regarding G are displayed on the axis of abscissa as $g_1$, $g_2$, $g_3$, $g_4$, . . . In addition, operation change point Eo can be displayed on the display unit by stopping the output of the data now being detected for a short period or changing the output to an output level regardless of the detected data.

According to this invention, the operation condition of a drive mechanism can be visually and easily displayed on a recorder or display tube during the operation and/or after the operation.

What is claimed is:

1. In a method of displaying monitoring data of a continuously varying operation condition of a drive mechanism driven by an actuator, in which data regarding the operation of the drive mechanism is detected as a variable of time and sampled, the data being output at an output frequency and then displayed, the improvement comprising the steps of:

storing detected data of one operation cycle of the drive mechanism as reference data;

preliminarily displaying the reference data;

visually superposing detected data of an operation cycle of the drive mechanism succeeding to said one operation cycle on said reference data on a coordinate axis to show deviation between the reference data and detected data of the succeeding operation cycle;

determining allowable uppermost and lowermost limits of said reference data;

storing said allowable uppermost and lowermost limits;

displaying said uppermost and lowermost limits of said reference data on said coordinate axis with the detected data; and counting an operation time of each operation cycle of the drive mechanism and adjusting a sampling fequency on the basis of the counted operation time and a frequency for outputting sampling data.

2. In a method of displaying monitoring data of a continuously varying operation condition of a drive mechanism driven by an actuator, in which data regarding the operation of the drive mechanism is detected as a variable of time and sampled, the data being output at an output frequency and then displayed, the improvement comprising the steps of:

storing detected data of one operation cycle of the drive mechanism as reference data;

preliminarily displaying the reference data;

visually superposing detected data of an operation cycle of the drive mechanism succeeding to said one operation cycle on said reference data on a coordinate axis to show deviation between the reference data and detected data of the succeeding operation cycle;

determining allowable uppermost and lowermost limits of said reference data;

storing said allowable uppermost and lowermost limits;

displaying said uppermost and lowermost limits of said reference data on said coordinate axis with the detected data;

calculating deviation data between said reference data and the detected data of said operation cycle succeeding said one operation cycle;

forming output data obtained by adding a predetermined constant bias data to said deviation data after said reference data has been stored; and counting an operation time of each operation cycle of the drive mechanism and adjusting a sampling frequency on the basis of the counted operation time and a frequency for outputting sampling data.

* * * * *